United States Patent
Teo et al.

(10) Patent No.: US 7,998,835 B2
(45) Date of Patent: Aug. 16, 2011

(54) STRAIN-DIRECT-ON-INSULATOR (SDOI) SUBSTRATE AND METHOD OF FORMING

(75) Inventors: Lee Wee Teo, Singapore (SG); Chung Foong Tan, Singapore (SG); Shyue Seng Tan, Singapore (SG); Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 714 days.

(21) Appl. No.: 12/008,841

(22) Filed: Jan. 15, 2008

(65) Prior Publication Data

US 2009/0179226 A1   Jul. 16, 2009

(51) Int. Cl.
*H01L 21/30* (2006.01)
*H01L 21/46* (2006.01)

(52) U.S. Cl. . 438/458; 438/455; 438/933; 257/E21.482; 257/E21.211

(58) Field of Classification Search .......... 438/455, 438/458, 459, 933; 257/E21.482, E21.211
See application file for complete search history.

(56) References Cited

U.S. PATENT DOCUMENTS

| | | | | |
|---|---|---|---|---|
| 5,534,713 | A * | 7/1996 | Ismail et al. | 257/24 |
| 5,906,951 | A * | 5/1999 | Chu et al. | 438/751 |
| 6,059,895 | A * | 5/2000 | Chu et al. | 148/33.1 |
| 6,107,653 | A | 8/2000 | Fitzgerald | |
| 6,291,321 | B1 | 9/2001 | Fitzgerald | |
| 6,593,641 | B1 | 7/2003 | Fitzergald | |
| 6,867,428 | B1 | 3/2005 | Besser et al. | |
| 7,459,374 | B2 * | 12/2008 | Aulnette et al. | 438/455 |
| 2005/0167002 | A1 * | 8/2005 | Ghyselen et al. | 148/33 |
| 2005/0196937 | A1 * | 9/2005 | Daval et al. | 438/455 |
| 2007/0032026 | A1 | 2/2007 | Ong et al. | |
| 2007/0138570 | A1 | 6/2007 | Chong et al. | |
| 2007/0267703 | A1 | 11/2007 | Chong et al. | |
| 2008/0142844 | A1 * | 6/2008 | Aulnette et al. | 257/191 |
| 2008/0261055 | A1 * | 10/2008 | Chu et al. | 428/428 |

OTHER PUBLICATIONS

Zhiyuan Cheng, et al., "Relaxed Silicon-Germanium on Insulator (SGOI)," Mat. Res. Soc. Symp. Proc., vol. 686, 2002, pp. A1.5.1-A1.5.6.

Dave Bursky, "Strained Silicon-on-Insulator Combats Leakage to Boost Circuit Performance," ED Online ID#8279, Jul. 5, 2004, Electronic Design, http://electronic-design.com/Articles/Index.cfm?AD=1&ArticleID=8279, 3 pages.

* cited by examiner

*Primary Examiner* — Angel Roman
(74) *Attorney, Agent, or Firm* — Munck Carter, LLP; Robert D. McCutcheon

(57) ABSTRACT

Methods (and semiconductor substrates produced therefrom) of fabricating (n−1) SDOI substrates using n wafers is described. A donor substrate (e.g., silicon) includes a buffer layer (e.g., SiGe) and a plurality of multi-layer stacks formed thereon having alternating stress (e.g., relaxed SiGe) and strain (e.g., silicon) layers. An insulator is disposed adjacent an outermost strained silicon layer. The outermost strained silicon layer and underlying relaxed SiGe layer is transferred to a handle substrate by conventional or known bonding and separation methods. The handle substrate is processed to remove the relaxed SiGe layer thereby producing an SDOI substrate for further use. The remaining donor substrate is processed to remove one or more layers to expose another strained silicon layer. Various processing steps are repeated to produce another SDOI substrate as well as a remaining donor substrate, and the steps may be repeated to produce n−1 SDOI substrates.

16 Claims, 4 Drawing Sheets

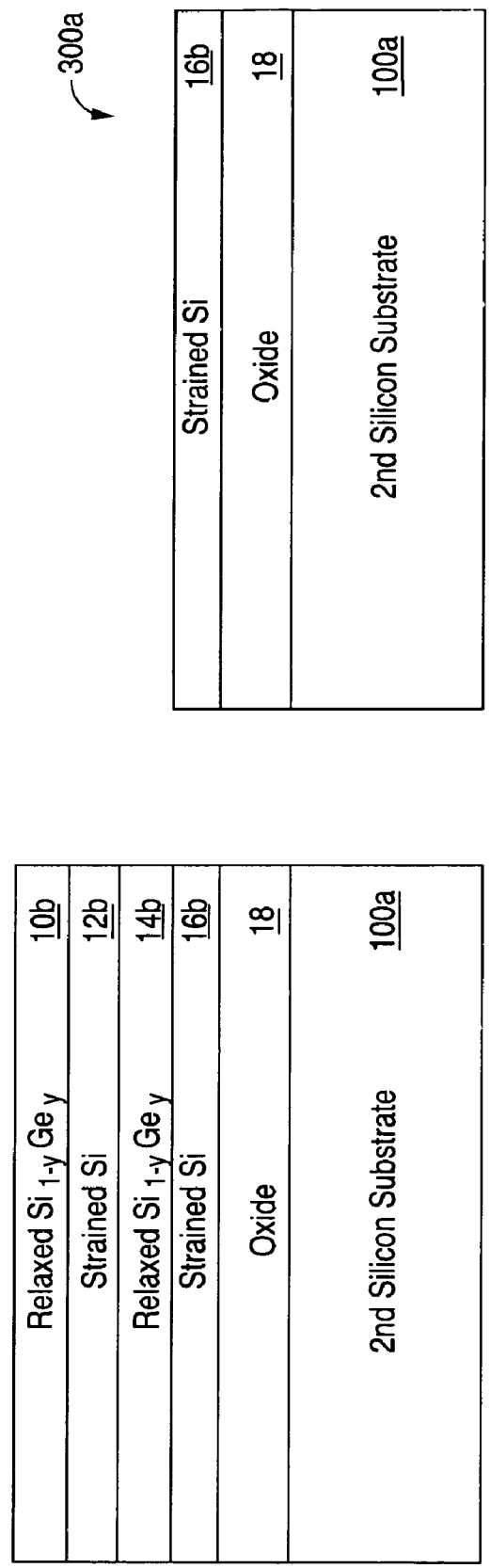

STRAIN-DIRECT-ON-INSULATOR (SDOI) SUBSTRATE AND METHOD OF FORMING

TECHNICAL FIELD

The present disclosure relates generally to semiconductor wafers and methods of fabrication, and more particularly to the formation or fabrication of Strain-Direct-On-Insulator (SDOI) substrates or wafers for use in integrated circuit (IC) fabrication processes.

BACKGROUND

The performance of semiconductor devices, specifically metal oxide semiconductor field effect transistor (MOSFET) devices, may be enhanced by using a strained silicon layer to accommodate the device channel region (introducing a strain along the length of the channel). This layer allows the device channel region to experience increased carrier mobility which increases device performance. This carrier transport enhancement mechanism through the utilization of strained silicon is relatively new.

One method of forming a strained silicon layer is to grow an epitaxial layer (or epilayer) of a semiconductor material having a first natural lattice constant on top of a substrate having a second natural lattice constant different from the first. A biaxially strained epitaxial layer of the overlying semiconductor material may thereby be formed. The term natural lattice constant is defined as the lattice constant of the bulk, unstrained crystalline material.

In one example, the epitaxial layer may be formed from silicon, and the substrate may be formed from a silicon germanium (SiGe) alloy or layer. Silicon has a natural lattice constant of approximately 5.43 Angstroms. Silicon germanium has a natural lattice constant of between 5.43 and 5.66 Angstroms, depending upon the concentration of germanium in the SiGe. The higher the concentration of germanium, the larger the natural lattice constant of the SiGe. With the natural lattice constant of SiGe is higher than that of silicon, the entire silicon epilayer will be in a state of biaxial tensile stress. U.S. Pat. No. 6,867,428 to Besser, et. al., incorporated herein by reference, discloses a strained silicon nFET having a strained silicon channel formed in such an epilayer.

However, the biaxial tensile channel is normally achieved by a complex and costly process flow. Since high Ge concentration in the relaxed SiGe layer is required in order to have both electron and hole enhancement, an underlying thick virtual substrate with a gradual increase or increment of Ge concentration is needed before forming the relaxed SiGe layer.

One prior art method of constructing these layers is described in U.S. Pat. No. 6,593,641 to Fitzgerald, which is incorporated herein by reference. Fitzgerald teaches a compositionally graded layer of SiGe having a relax SiGe layer formed thereon. Fitzgerald teaches forming the composition graded SiGe layer on a first silicon substrate, with a relax SiGe layer formed thereon. The relaxed SiGe layer is then "transferred" to a second silicon substrate using conventional bonding. The composition graded SiGe layer and the first silicon substrate are then removed, resulting in the second silicon substrate with relaxed SiGe layer. Fitzgerald alternatively teaches an SiGe on insulator substrate (termed an "SGOI") where the second substrate may be coated with silicon dioxide before bonding to the relax SiGe layer, or both wafers can be coated with silicon dioxide to enable oxide-to-oxide bonding. This structure is now commonly referred to as a Strain-Si-Direct-On-Insulator (SSDOI) structure.

As described in Fitzgerald, and similar to SOI formation, two semiconductor wafers are needed to form a single SSDOI wafer. The wafers are bonded followed by separation at a predetermined location (the relax SiGe layer) to form one SSDOI wafer. In addition, formation of the relatively thick composition-graded or buffer SiGe layer is time-consuming and complicated.

Therefore, the prior art processing techniques for forming SSDOI wafers are complex, costly and time-consuming because two wafers are required in order to form a single SSDOI substrate/wafer.

Accordingly, there are needed improved fabrication processes and semiconductor wafer/substrates that reduce cost and increases throughput improvement over the existing processes. In general terms, the present disclosure describes processes and semiconductor wafer structure(s) that enable the formation of (n−1) SSDOI wafers by using the n wafers.

SUMMARY

In accordance with one embodiment, there is provided a semiconductor substrate having a first substrate and a second substrate. The first substrate includes a first base substrate, a first buffer layer, a first stress layer, a first strained layer disposed on the first stress layer, a second stress layer, and a second strained layer disposed on the first stress layer, with the second stress layer disposed between the first and second strained layers. The second substrate includes a second base substrate bonded to the first substrate, wherein the first buffer layer, the first and second stress layers and the first and second strained layers are disposed between the first substrate and the second substrate.

In accordance with another embodiment, there is provided a method of forming a semiconductor substrate for use in integrated circuits. The method includes providing a first substrate having a first base substrate; forming a first buffer layer on the first base substrate; forming a first stress layer on the first buffer layer; forming a first strained layer on the first stress layer; forming a second stress layer; and forming a second strained layer on the second stress layer. A second substrate having a second base substrate is bonded to the first substrate, such that the first buffer layer, the first and second stress layers and the first and second strained layers are disposed between the first base substrate and the second base substrate.

In yet another embodiment, there is provided a semiconductor device having a first substrate and a second substrate. The first substrate includes a first base substrate, a buffer layer, and a plurality of multi-layer structures, each multi-layer structure comprising at least one stress layer and at least one strained layer. The second substrate includes a second base substrate bonded to the first substrate, wherein the plurality of multi-layer structures are disposed between the first base substrate and the second base substrate.

In still another embodiment, there is provided a method of forming a semiconductor substrate for use in an integrated circuit fabrication process. The method includes providing a first substrate; forming a buffer layer on the first substrate; and forming a plurality of multi-layer structures on the buffer layer, with each multi-layer structure comprising at least one strained layer. A second substrate is bonded to the first substrate, wherein the buffer layer and the plurality of multi-layer structures are disposed between the first substrate and the second substrate.

In another embodiment, there is provide a method of fabricating (n−1) strain-silicon-direct-on-insulator (SSDOI) semiconductor substrate wafers, for use in further integrated circuit (IC) processing, using n semiconductor substrate wafers, where n equals two or more. The method includes (a) providing a first semiconductor substrate wafer having a first base substrate; (b) forming a buffer layer on the first substrate; (c) forming (n−1) multi-layer structures on the buffer layer, each multi-layer structure comprising at least one strained layer; (d) bonding a second semiconductor substrate wafer having a second base substrate to the first substrate to create a bonded wafer structure, wherein the buffer layer and the (n−1) multi-layer structures are disposed between the first base substrate and the second base substrate; and (e) separating a first portion from a second portion of the bonded wafer structure at a predetermined location within a given one of the (n−1) multi-layer structures wherein the first portion is an SSDOI wafer, the separated SSDOI wafer comprising the second semiconductor substrate wafer and the at least one strained layer of the given one of the (n−1) multi-layer structures.

In yet another embodiment, there is provided a method of forming a two or more semiconductor wafers for use in an integrated circuit fabrication process. The method includes providing a first semiconductor wafer having a first base substrate; forming a base layer on the first substrate; forming a first plurality of layers above the base layer; and forming a second plurality of layers above the first plurality of layers. At least a portion of the second plurality of layers is transferred to a second semiconductor wafer, the second semiconductor wafer having a second base substrate. Thereafter, at least a portion of the first plurality of layers is transferred to a third semiconductor wafer, the third semiconductor wafer having a third base substrate.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIGS. 3A and 3B are cross-sectional views illustrating an SSDOI substrate structure separated from the intermediate substrate structure shown in FIG. 2 and an SSDOI substrate ready for further IC processing produced from the SSDOI substrate structure shown in FIG. 3A, respectively.

DETAILED DESCRIPTION

In general terms, the present disclosure describes processes and intermediate wafer structures that allow n−1 SSDOI wafers to be produced using n wafers. Alternating stack layers of stress material (e.g., relaxed SiGe) and strain material (e.g., silicon) are formed on a buffer layer (e.g., composition-graded SiGe layer) of a substrate (e.g. silicon wafer). A portion of the stack layer, such as a relaxed SiGe layer and strained silicon layer disposed thereon, are transferred to a second substrate (e.g., second silicon wafer) through a wafer bonding and removal technique.

In this process, and using relaxed SiGe and silicon as examples of the stress layers and strained layers, respectively, and silicon wafers as the substrates, an insulator is disposed on the top-most layer of strained silicon (e.g., it is formed on the strained silicon, on the second substrate wafer, or on both wafers) and these layers are transferred to the second silicon wafer using bonding. The second silicon wafer is removed from the combined bonded two-wafer structure at a predetermined location (usually within a relaxed SiGe layer) leaving the second silicon wafer with the insulator, a strained silicon layer and a relaxed SiGe layer (or portion thereof). The second silicon wafer is processed (e.g., etched/polished) to remove any remnants of the relax SiGe layer leaving the SSDOI wafer ready for further IC processing. The base silicon wafer is processed (e.g., etched/polished) to remove any remnants of the cut relaxed SiGe layer, exposing another strained silicon layer. At this time, the base silicon wafer is ready to receive another insulator layer and bonding to another silicon wafer. The process may be repeated based on the number of alternating stack layers formed on the base silicon layer. This process enables fabrication or formation of n−1 SSDOI wafers using n wafers. In other words, a single base silicon wafer is used as the host or donor for all of the transferred layers of strained silicon and relaxed SiGe formed thereon.

Figure 1:
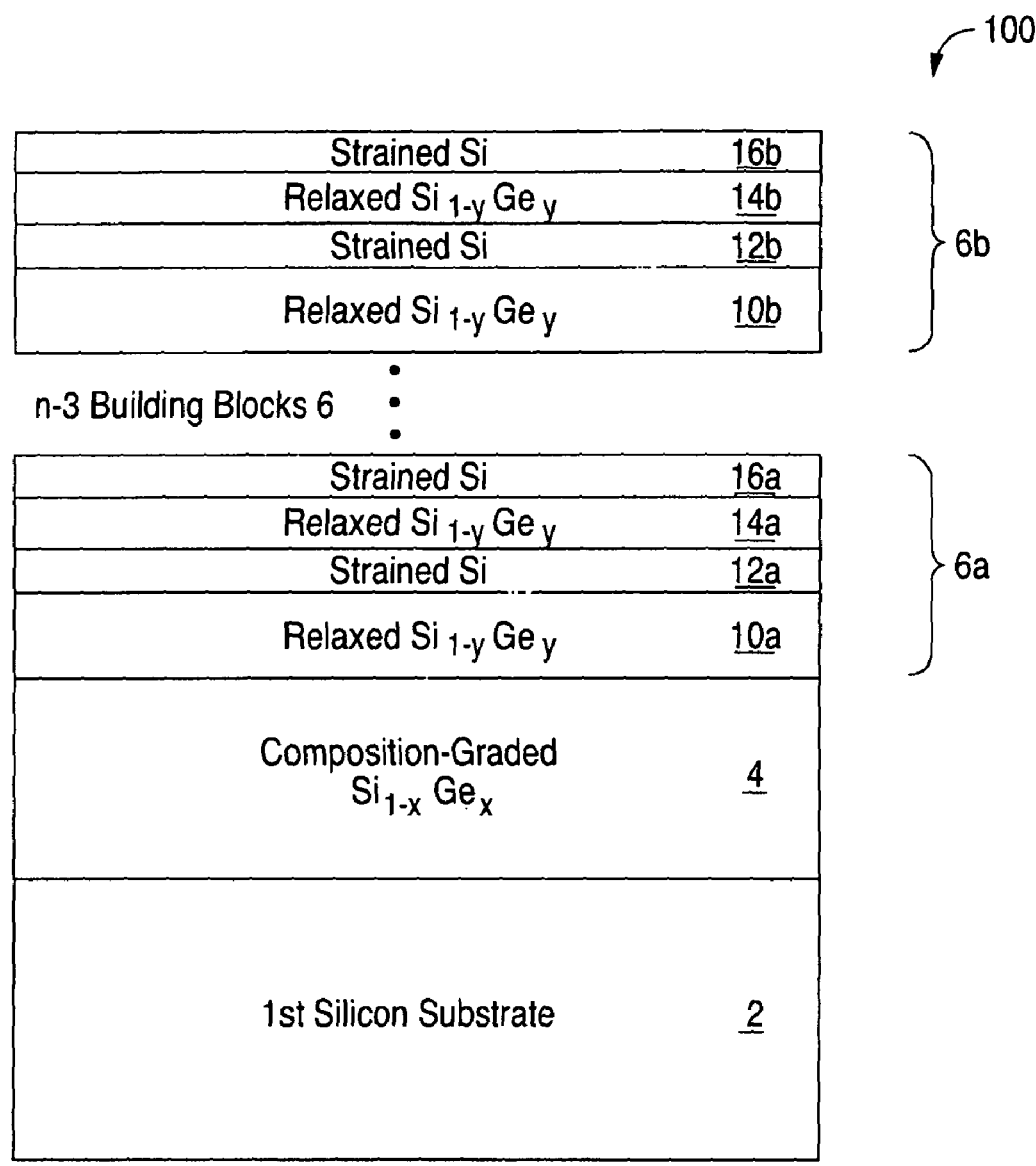
FIG. 1 is a cross-sectional view illustrating a semiconductor wafer or substrate in accordance with the present disclosure.

Referring now to FIG. 1, there is depicted a cross-sectional view of a semiconductor wafer or substrate 100 in accordance with the present disclosure. The terms "wafer" and "substrate" may be used interchangeably herein. The semiconductor wafer 100 includes a first silicon wafer or substrate 2 that provides or functions as a base or donor wafer/substrate. A buffer layer 4 (e.g., composition-graded silicon-germanium (SiGe)) is formed on the silicon substrate 2. The formation and composition of the composition-graded SiGe layer 4 is well known in the art, and such layer is described more fully in U.S. Pat. No. 6,593,641. In this embodiment, composition graded refers to sequential increment in the Ge content from a first value (e.g., 0%) at the interface with the substrate 2 to the desired percentage Ge content at the interface with the SiGe relaxed layer 10a.

It will be understood that the substrate 2 basically serves as a mechanical support for the other layers. The material(s) that may be chosen for the substrate are those which enable atoms in the buffer layer 4 to be miscible within it. This helps reduce the number of dislocations formed. In one embodiment, the substrate 2 is silicon and the buffer layer 4 is SiGe. In other embodiments, the substrate 2 may be germanium or III-V compounds. The buffer layer 4 is a stress (or stressor) layer that acts to induce strain in layers formed thereon. In one embodiment, the buffer layer 4 is a composition-graded SiGe layer. In other embodiments, other materials may be used as the strain layer (e.g., silicon) such as indium-gallium arsenide (InGaAs) or other suitable III-V compounds.

A plurality of multi-layer structures 6 are formed on the composition-graded SiGe layer 4, with each multi-layer structure 6 including alternating layers of strained silicon and relaxed SiGe layers. As shown, each of the multi-layer stacks 6 includes a first relaxed SiGe layer 10, a first strained silicon layer 12, a second relaxed SiGe layer 14, and a second strained silicon layer 16. Formation of each individual layer is well-known in the art.

It will be understood that the wafer 100 may be formed with one, two or greater number of multi-layer stacks 6. The example wafer 100 depicted in FIG. 1 is shown with a first multi-layer stack 6a disposed on the composition-graded SiGe layer 4 and a second multi-layer stack 6b formed as the outermost layer of the substrate 100. In between these, additional multi-stack layers 6 may be formed. The number of additional stacks 6 will usually equal n−3, where n equals the number of wafers used to form n−1 SSDOI substrates, thus there will exist a stack 6 for use with each SSDOI substrate to be formed using the donor substrate 100. Stacks 6 function as basic building blocks and incorporate material layers that will ultimately be transferred to other silicon wafers (as described more fully further below).

Processing or formation of the donor substrate 100 (as shown in FIG. 1) includes providing the silicon wafer/substrate 2 and forming the composition-graded SiGe layer 4 thereon. Formation of the multi-layer structure 6a includes forming the relaxed SiGe layer 10a with the strained silicon layer 12a formed thereon. Another relaxed SiGe layer 14a is formed with another strained layer 16a formed thereon. These steps are repeated to form the additional multi-layer structure 6b, and perhaps others.

In one embodiment, the relaxed layer SiGe 10 has a thickness greater than a thickness of the relaxed layer SiGe 14. The layers 4 through 14 are formed to substantially or entirely cover the silicon wafer/substrate 2. It will be understood that only a portion of the entire silicon wafer/substrate 2 may include such layers thereon.

After forming (or providing) the first silicon substrate 100, hydrogen is implanted at predetermined location within the relaxed SiGe layer 14b. Implanting hydrogen in the relaxed SiGe layer 14b enables hydrogen-induced wafer delamination within layer 14b at the desired time. Additional information about such delamination process may be found in Cheng, et al., "Relaxed Silicon-Germanium On Insulator (SGOI)," Mat. Res. Soc. Symp. Proc., Vol. 686, pages A1.5.1-A1.5.6, Materials Research Society, which is incorporated herein by reference. It will be noted in this regard that the relaxed SiGe layers 14 also serve as sacrificial or delamination layers (as will be described further below). The implant step may be done before or after insulator 18 formation (see below). The implant energy will be controlled accordingly.

Figure 2:
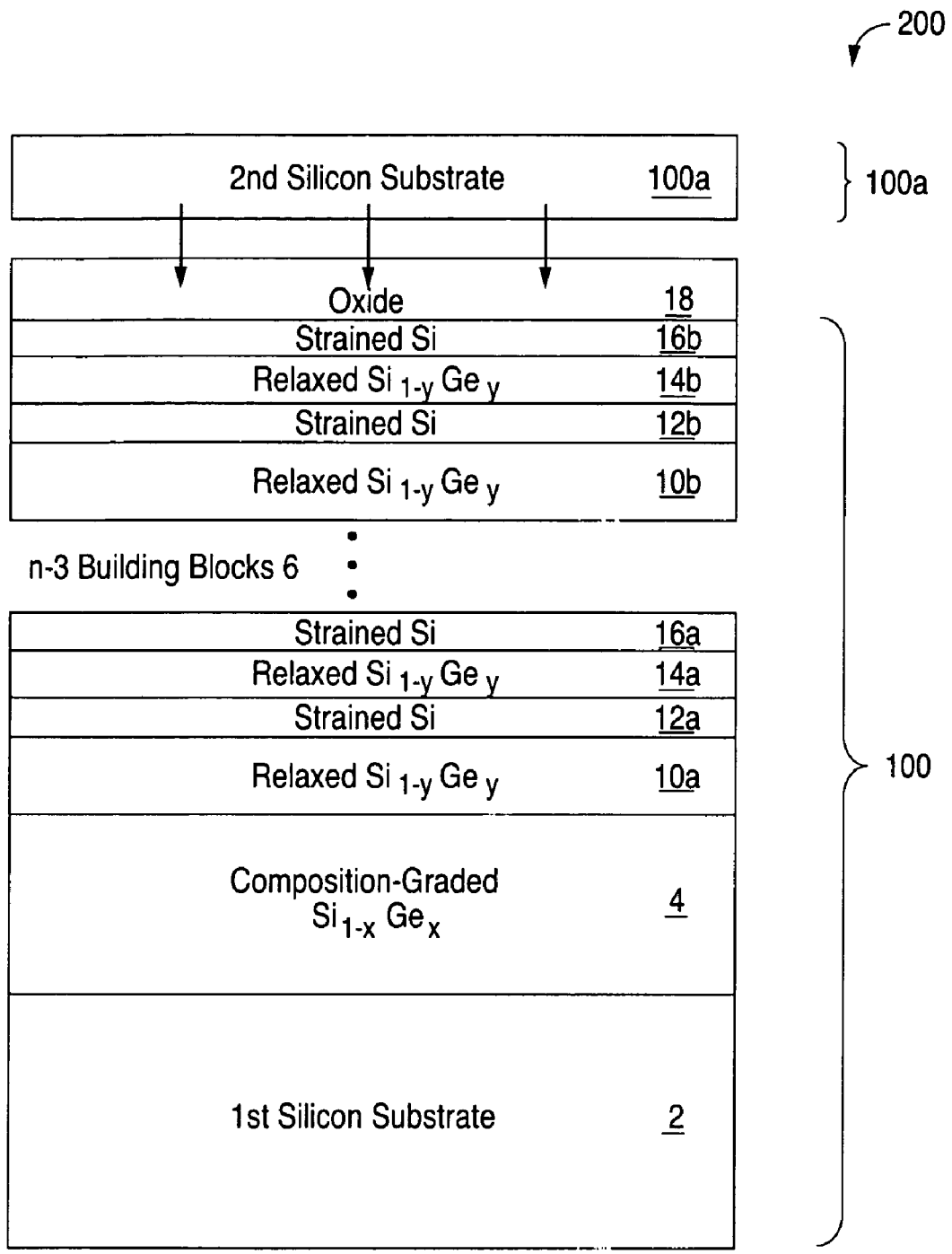
FIG. 2 is a cross-sectional view illustrating an intermediate substrate structure including a second substrate bonded to the wafer or substrate shown in FIG. 1.

Now turning to FIG. 2, there is illustrated a cross-section view of a second silicon wafer or substrate 100a bonded to the substrate 100 (shown in FIG. 2). The second silicon substrate 100a is commonly referred to as the "handle" wafer/substrate. An insulator 18 (e.g., silicon oxide) is disposed adjacent the outermost strained silicon layer 16b by forming the insulator 18 on the layer 16b. As will be described, the multi-layer structure 6b (layers 16b, 14b, 12b and a portion of layer 10b) is transferred to the second silicon substrate 100a using conventional bonding. The second substrate 100a is bonded to the first substrate 100 with the insulator 18 disposed between the strained silicon layer 16b and the second silicon substrate 100a. In an alternative embodiment, the second silicon substrate 200 may have the insulator 18 formed thereon, or both silicon substrates 100a, 100b may have an insulator layer formed thereon (to enable oxide-to-oxide bonding).

Similar to substrate 2, the substrate 100b serves as a mechanical support for other layers. In one embodiment, the substrate 100b is silicon. In other embodiments, the substrate 2 may be germanium, III-V compounds or other materials.

After formation of the combined two-substrate structure 200 illustrated in FIG. 2, the first and second silicon substrates 100, 100a are delaminated (separated from each other) at the point (shown by the dotted line) of hydrogen implantation within the relaxed SiGe layer 14b. This can be done by following a process known in the art as a "smart cut." Other techniques may be utilized to separate the wafers at the desired location. Separation results in two substrates—an SSDOI substrate structure 300 illustrated in FIG. 3A (also referred to as the "handle" substrate) and a base/donor substrate structure 400 illustrated in FIG. 4A. The SSDOI substrate structure 300 includes the insulating layer and at least a portion of the multi-layer stack affixed thereto. The base/donor substrate structure 400 originates from the first silicon substrate 100a (shown in FIG. 1), however, with the first multi-layer structure 6 (most of it) has been transferred to the substrate 10a.

With reference to FIGS. 3A and 3B, there is shown processing of the resulting SSDOI substrate structure 300 using a three-step etch process to remove the layers 10b, 12b and 14b to produce an SSDOI wafer or substrate 300a shown in FIG. 3B. Etch-stop processing in three separate steps may be used. Removal of layers 10b, 12b, and 14b may be accomplished by other processes known to those skilled in the art. This SSDOI substrate 300a is now ready for use in conventional integrated circuit (IC) process(es) including the fabrication of strained channel devices.

Because the smart cut process may not yield a flat surface for the remaining SiGe layer 10b, adding "sacrificial" layers 12b and 14b to the stack 6 additionally helps accurately control the final thickness of the strained silicon layer 16b on the substrate 100a. Thus, the initial "rough" SiGe layer 10b is etched using selective etching that stops on the "dummy" strained silicon layer 12b. The strained silicon layer 12b is etched and stopped on another "dummy" SiGe layer 14b. The final etch is a slower etch that removes the SiGe layer 14b leaving a controllable thickness and relatively flat strained silicon layer 16b on the insulator 18.

Figures 4A, 4B:
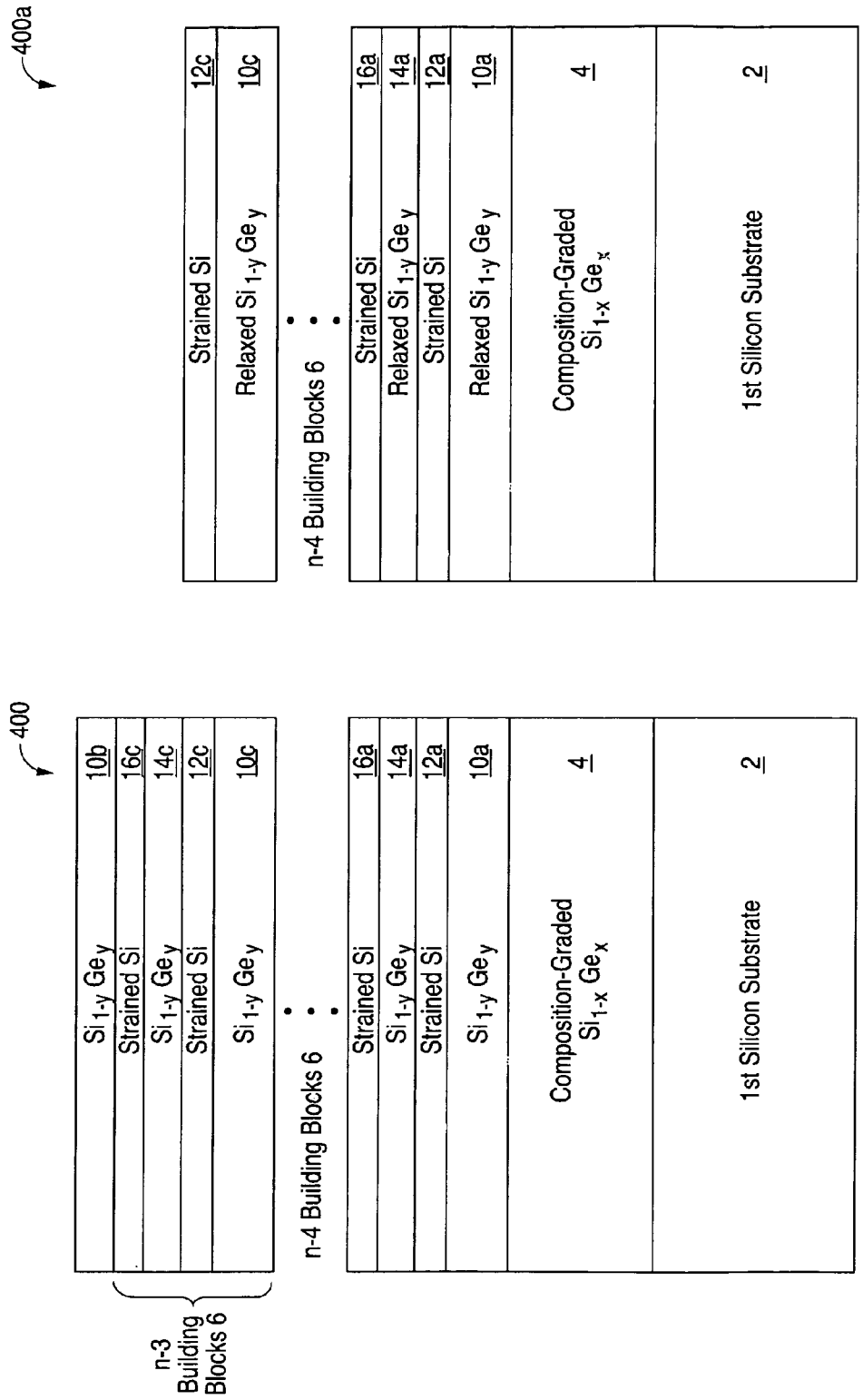
FIGS. 4A and 4B are cross-sectional views illustrating a remaining donor substrate structure separated from the intermediate substrate structure shown in FIG. 2 and a donor substrate ready for use in producing an additional SSDOI, respectively.

With reference to FIGS. 4A and 4B, there is shown the post-separation processing of the resulting base/donor substrate structure 400. The remaining relaxed SiGe layer 10b is removed to expose the next underlying multilayer stack 6 (e.g., stack 6c). The strained silicon layer 16c and relaxed SiGe layer 14c of this stack 6c are removed Removal of these layers produces an intermediate donor substrate 400a shown in FIG. 4B. Etch-stop processing or other removal process(es) known to those skilled in the art may be used to remove layers 10b, 16c and 14c. Similarly, the etching may only be applied to the SiGe layer 10b if the stack 6 includes only one SiGe layer and one strained silicon layer. This processing conditions or converts the substrate 400 into the substrate 400a for a repeat of certain processing steps, including (a) hydrogen implantation into the relaxed SiGe layer 10c, (b) insulator formation adjacent the strained silicon layer 12c, and (c) bonding of another substrate (substrate 100a) to the substrate 400a to eventually produce another SDDOI substrate structure 300, 300a using the remaining portion of the original donor substrate 100a (e.g. substrate 400a).

It will be understood that these processing steps are repeated to produce n−1 number of SSDOI substrates 300a from n number of wafers. In this manner, only one donor substrate 100 (having multiple multi-layer stacks 6 thereon) is needed to produce n−1 SSDOI substrates. Implementation of the methods and structures described herein enable the production of n−1 SSDOI wafers using n wafers. Economies of production improve as n increases compared to the prior art which require two wafers for each SSDOI produced. The present disclosure reduces production time by eliminating the long time duration necessary to form the thick composition-graded SiGe buffer layer each time one SSDOI wafer is produced. Only one buffer layer is necessary to form n−1 wafers when using n wafers in accordance with the teachings herein. As a result, cost and throughput improvements are achieved.

In the embodiment shown in FIG. 1, the multi-layer stacks 6 each include four alternating layers of relaxed SiGe and strained silicon. In another embodiment, the stacks 6 may include a single relaxed SiGe layer and a single strained silicon layer formed thereon. In either embodiment, the number of multi-layer stacks or basic building blocks 6 will usually equal the number (n−1) SSDOI substrates desired to be produced using the single donor substrate 100.

The order of steps or processing can be changed or varied from that described above. It will be understood that well known process have not been described in detail and have been omitted for brevity. Although specific steps, insulating materials, conductive materials and apparatuses for depositing and etching these materials may have been described, the present disclosure may not limited to these specifics, and others may substituted as is well understood by those skilled in the art.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of forming a semiconductor substrate for use in an integrated circuit fabrication process, the method comprising:
   providing a base substrate;
   forming a buffer layer on the base substrate;
   forming a multi-layer structure on the buffer layer, wherein forming the multi-layer structure comprises,
      forming a first stress layer,
      forming a first strained layer on the first stress layer,
      forming a second stress layer above the first strained layer, and
      forming a second strained layer on the second stress layer;
   wherein the base substrate, the buffer layer and the multi-layer structure forms a first substrate;
   bonding a second substrate to the first substrate, wherein the buffer layer and the multi-layer structure are disposed between the base substrate and the second substrate; and
   transferring the second strained layer, the second stress layer and the first strained layer to the second substrate.

2. The method in accordance with claim 1 further comprising:
   forming an insulator on the second strained layer within the multi-layer structure on the first substrate; and
   bonding the second substrate to the insulator.

3. The method in accordance with claim 1 wherein forming the first stress layer further comprises:
   forming the first stress layer with a thickness greater than a thickness of the second layer.

4. The method in accordance with claim 1 wherein forming the buffer layer further comprises:
   forming a composition-graded SiGe layer.

5. The method in accordance with claim 1 wherein the first and second stress layers are relaxed SiGe layers and the first and second strained layers are strained silicon layers.

6. A method of fabricating (−1) strain-silicon-direct-on-insulator (SSDOI) semiconductor substrate wafers, for use in further integrated circuit (IC) processing, using n semiconductor substrate wafers, where n equals two or more, the method comprising:
   (a) providing a first semiconductor substrate wafer having a first substrate;
   (b) forming a buffer layer on the first substrate;
   (c) forming (−1) multi-layer structures on the buffer layer, wherein forming each multi-layer structure comprises,
      forming a first stress layer,
      forming a first strained layer on the first stress layer,
      forming a second stress layer above the first strained layer, and
      forming a second strained layer on the second stress layer;
   (d) bonding a second semiconductor substrate wafer having a second substrate to the first semiconductor substrate wafer to create a bonded wafer structure, wherein the buffer layer and the (−1) multi-layer structures are disposed between the first substrate and the second substrate; and
   (e) separating a first portion from a second portion of the bonded wafer structure at a predetermined location within a given one of the (−1) multi-layer structures wherein the first portion is an SSDOI wafer, the separated SSDOI wafer comprising the second semiconductor substrate wafer and the second strained layer, the second stress layer, the first strained layer, and at least a portion of the first stress layer of the given one of the (−1) multi-layer structures.

7. The method in accordance with claim 6 wherein the given one of the (−1) multi-layer structures is positioned farthest from the first substrate, and the method further comprises:
   forming an insulating layer on the second strained layer of the given one of the (−1) multi-layer structures; and
   bonding the second substrate to the insulating layer after forming the insulating layer.

8. A method in accordance with claim 7 further comprising:
   removing any remaining remnants of the given (−1) multi-layer structure on the first semiconductor substrate wafer; and
   repeating steps (d) and (e) one or more times using one or more additional semiconductor substrates to form one or more additional SSDOI wafers.

9. The method in accordance with claim 7 wherein the first and second stress layers are relaxed SiGe layers and the first and second strained layers are strained silicon layers.

10. The method in accordance with claim 6 wherein forming the first stress layer in each (−1) multi-layer structure further comprises:
    forming the first stress layer with a thickness greater than a thickness of the second stress layer.

11. A method of forming two or more semiconductor wafers for use in an integrated circuit fabrication process, the method comprising:
- providing a first semiconductor wafer having a first base substrate;
- forming a base layer on the first substrate;
- forming a first plurality of layers above the base layer, wherein forming the first plurality of layers comprises,
  - forming a first stress layer,
  - forming a first strained layer on the first stress layer,
  - forming a second stress layer above the first strained layer, and
  - forming a second strained layer on the second stress layer;
- forming a second plurality of layers above the first plurality of layers, wherein forming the second plurality of layers comprises,
  - forming a third stress layer,
  - forming a third strained layer on the third stress layer,
  - forming a fourth stress layer above the third strained layer, and
  - forming a fourth strained layer on the fourth stress layer;
- transferring the fourth strained layer, the fourth stress layer, the third strained layer and at least a portion of the third stress layer of the second plurality of layers to a second semiconductor wafer, the second semiconductor wafer having a second base substrate; and
- transferring the second strained layer, the second stress layer, the first strained layer and at least a portion of the first stress layer of the first plurality of layers to a third semiconductor wafer, the third semiconductor wafer having a third base substrate.

12. The method in accordance with claim 11 wherein forming the base layer further comprises:
- forming a composition graded silicon germanium (SiGe) layer.

13. The method in accordance with claim 11 wherein the first, second, third and fourth stress layers are relaxed SiGe layers and the first, second, third and fourth strained layers are strained silicon layers.

14. The method in accordance with claim 11 wherein transferring the fourth strained layer, the fourth stress layer, the third strained layer and at least a portion of the third stress layer of the second plurality of layers to the second semiconductor wafer further comprises:
- forming a first insulating layer on the fourth strained layer;
- bonding the second semiconductor wafer to the first semiconductor wafer; and
- separating the second semiconductor wafer from the first semiconductor wafer at the third stress layer, the separated second semiconductor wafer including the first insulating layer and the fourth strained layer, the fourth stress layer and the third strained layer of the second plurality of layers affixed thereto.

15. The method in accordance with claim 14 further comprising:
- implanting hydrogen substantially at the predetermined location.

16. The method in accordance with claim 15 wherein transferring the second strained layer, the second stress layer and the first strained layer and at least a portion of the first stress layer of the first plurality of layers to the third semiconductor wafer further comprises:
- forming a second insulating layer on the second strained layer;
- bonding the third semiconductor wafer to the first semiconductor wafer; and
- separating the third semiconductor wafer from the first semiconductor wafer at the first stress layer, the separated third semiconductor wafer including the second insulating layer and the second strained layer, the second stress layer and the first strained layer of the first plurality of layers affixed thereto.

* * * * *

UNITED STATES PATENT AND TRADEMARK OFFICE
CERTIFICATE OF CORRECTION

PATENT NO. : 7,998,835 B2  Page 1 of 1
APPLICATION NO. : 12/008841
DATED : August 16, 2011
INVENTOR(S) : Lee Wee Teo et al.

It is certified that error appears in the above-identified patent and that said Letters Patent is hereby corrected as shown below:

Column 6, line 13, delete "10a" and insert -- 100a --.

Column 6, line 40, after "removed" insert -- . --.

Signed and Sealed this
Fifteenth Day of November, 2011

David J. Kappos
*Director of the United States Patent and Trademark Office*